United States Patent
Zhu et al.

(10) Patent No.: US 10,461,780 B2
(45) Date of Patent: Oct. 29, 2019

(54) MALLEABLE ERROR CONTROL CODE STRUCTURES SUITABLE FOR ADAPTIVE ERROR PROTECTION

(71) Applicant: Cisco Technology, Inc., San Jose, CA (US)

(72) Inventors: Xiaoqing Zhu, Austin, TX (US); Ahmed Badr, Toronto (CA); Wai-tian Tan, Sunnyvale, CA (US); Ashish Khisti, Toronto (CA); John Apostolopoulos, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 356 days.

(21) Appl. No.: 15/405,587

(22) Filed: Jan. 13, 2017

(65) Prior Publication Data

US 2018/0205394 A1    Jul. 19, 2018

(51) Int. Cl.
*H03M 13/00* (2006.01)
*H03M 13/29* (2006.01)
(Continued)

(52) U.S. Cl.
CPC ....... *H03M 13/2906* (2013.01); *H03M 13/05* (2013.01); *H03M 13/353* (2013.01);
(Continued)

(58) Field of Classification Search
CPC .. H03M 13/2906; H04L 1/0058; H04L 1/007; H04L 1/0041; H04L 1/0014; H04L 1/0003; H04L 1/0026; H04L 1/0017; H04L 1/0009; H04L 1/0006; H04L 1/0057; H04N 21/23617; H04N 21/23655; H04N 21/2383; H04N 21/2389; H04N 21/2402; H04N 21/26291; H04N 21/2662; H04N 21/41407; H04N 21/4349; H04N 21/4382; H04N 21/4385; H04N 21/4755; H04N 21/6131;
(Continued)

(56) References Cited

U.S. PATENT DOCUMENTS 6,301,558 B1   10/2001   Isozaki
7,751,324 B2   7/2010    Vadakital et al.
(Continued)

FOREIGN PATENT DOCUMENTS

WO    2016044877 A1    3/2016

*Primary Examiner* — Guerrier Merant
(74) *Attorney, Agent, or Firm* — Merchant & Gould P.C.

(57) ABSTRACT

In various implementations, a method includes determining a sequence of source packets. In some implementations, the sequence of source packets satisfies a windowing condition. In various implementations, the method includes synthesizing a first set of one or more parity packets as a function of a first set of source packets in the sequence. In some implementations, the first set of source packets satisfies a first encoding pattern. In various implementations, the method includes synthesizing a second set of parity packets as a function of a second set of source packets in the sequence. In some implementations, the second set of source packets satisfies a second encoding pattern that is different from the first encoding pattern. In some implementations, the first and second encoding patterns characterize an encoding structure determined as a function of a channel characterization vector.

20 Claims, 9 Drawing Sheets

(51) Int. Cl.
   *H04L 1/00*   (2006.01)
   *H03M 13/05*  (2006.01)
   *H03M 13/35*  (2006.01)

(52) U.S. Cl.
   CPC .......... *H03M 13/356* (2013.01); *H04L 1/007* (2013.01); *H04L 1/0014* (2013.01); *H04L 1/0041* (2013.01); *H04L 1/0058* (2013.01)

(58) Field of Classification Search
   CPC ............. H04N 21/6181; H04N 21/631; H04N 21/6375; H04N 21/6405; H04N 21/6547; H04N 21/84; H04N 21/8451; H04N 21/26616; H04N 19/164; H04N 19/89; H04N 19/40; Y02D 50/10
   See application file for complete search history.

(56) References Cited

U.S. PATENT DOCUMENTS

| | | | |
|---|---|---|---|
| 8,839,078 B2 | 9/2014 | Abu-Surra et al. | |
| 8,948,272 B2 | 2/2015 | Vojcic et al. | |
| 2002/0157058 A1* | 10/2002 | Ariel | H03M 13/27 714/774 |
| 2006/0150055 A1* | 7/2006 | Quinard | H04L 1/0009 714/752 |
| 2009/0254794 A1* | 10/2009 | Malik | H04L 1/0041 714/776 |
| 2012/0011413 A1* | 1/2012 | Liu | H04L 1/0009 714/746 |
| 2013/0263201 A1* | 10/2013 | Chung-How | H04L 1/0003 725/116 |
| 2019/0041846 A1* | 2/2019 | Cella | H04L 1/0002 |

\* cited by examiner

MALLEABLE ERROR CONTROL CODE STRUCTURES SUITABLE FOR ADAPTIVE ERROR PROTECTION

TECHNICAL FIELD

The present disclosure relates generally to error protection, and in particular, to encoding systems, methods and devices suitable for error control coding.

BACKGROUND

Many communication systems utilize error control and/or correction methods to compensate for packet loss and/or data corruption. Many traditional error correction codes are often configured to improve the probability of recovering all losses. In other words, many traditional error correction codes are configured to obtain a total recovery. However, some traditional error correction codes fail to recover any data when a total recovery is not feasible. In other words, utilizing some traditional error correction codes leads to a complete failure of recovering data when complete recovery is unfeasible. As such, many traditional error correction codes tend to perform poorly when a total recovery is not feasible. Some networks tend to exhibit losses in bursts rather than being dispersed. For example, in such networks, packet losses often occur in relatively short sequences followed by periods of lossless transmission. One problem with bursty data loss is that the probability of a total recovery is greatly reduced. As such, the use of traditional error correction codes in a bursty network is often characterized by numerous recovery failures.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
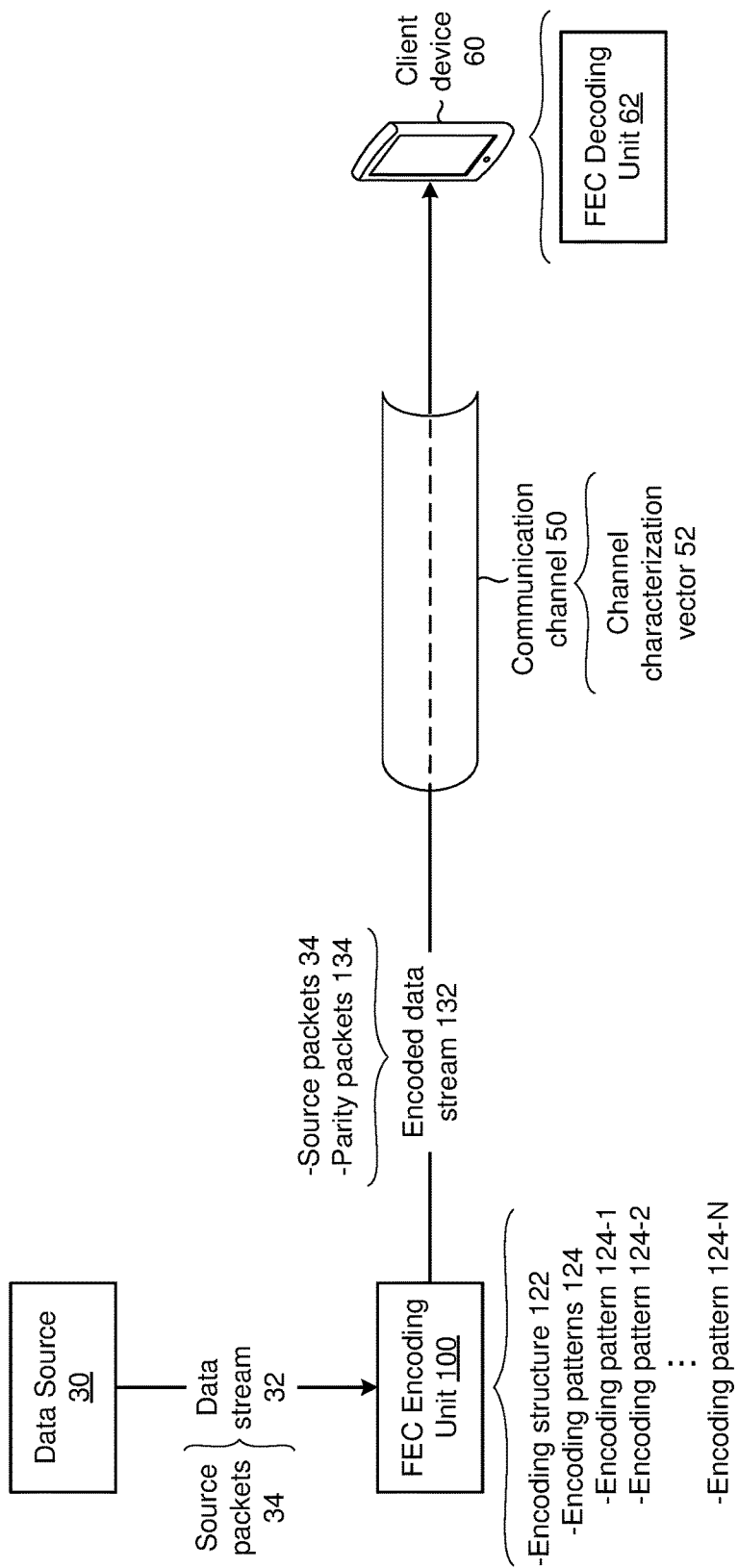
FIG. 1 is a schematic diagram of an encoding environment that includes an encoding unit that is configured to synthesize parity packets in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION OF EXAMPLE EMBODIMENTS

Numerous details are described herein in order to provide a thorough understanding of the illustrative implementations shown in the accompanying drawings. However, the accompanying drawings merely show some example aspects of the present disclosure and are therefore not to be considered limiting. Those of ordinary skill in the art will appreciate from the present disclosure that other effective aspects and/or variants do not include all of the specific details of the example implementations described herein. While pertinent features are shown and described, those of ordinary skill in the art will appreciate from the present disclosure that various other features, including well-known systems, methods, components, devices, and circuits, have not been illustrated or described in exhaustive detail for the sake of brevity and so as not to obscure more pertinent aspects of the example implementations disclosed herein.

Overview

Various implementations disclosed herein enable synthesizing parity information. For example, in various implementations, a method of synthesizing parity information is performed by a communications device. In various implementations, the communications device includes one or more processors, a non-transitory memory, and one or more network interfaces. In various implementations, the method includes determining a sequence of source packets. In some implementations, the sequence of source packets satisfies a windowing condition. In various implementations, the method includes synthesizing a first set of one or more parity packets as a function of a first set of source packets in the sequence. In some implementations, the first set of source packets satisfies a first encoding pattern. In various implementations, the method includes synthesizing a second set of parity packets as a function of a second set of source packets in the sequence. In some implementations, the second set of source packets satisfies a second encoding pattern that is different from the first encoding pattern. In some implementations, the first and second encoding patterns characterize an encoding structure determined as a function of a channel characterization vector.

EXAMPLE EMBODIMENTS

FIG. 1 is a schematic diagram of an encoding environment 10. While certain specific features are illustrated, those of ordinary skill in the art will appreciate from the present disclosure that various other features have not been illustrated for the sake of brevity and so as not to obscure more pertinent aspects of the example implementations disclosed herein. To that end, the encoding environment 10 includes a data source 30, a communication channel 50, a client device 60 (e.g., a mobile communication device such as a smartphone, tablet computer, or a laptop computer), and a forward error correction (FEC) encoding unit 100 ("encoding unit 100", hereinafter for the sake of brevity). In the example of FIG. 1, the encoding unit 100 is separate from the data source 30. In some implementations, the encoding unit 100 is a part of the data source 30 (e.g., the encoding unit 100 is integrated into the data source 30). Briefly, in various implementations, the data source 30 generates a data stream 32, and the encoding unit 100 encodes the data stream 32 to produce an encoded data stream 132 that the encoding unit 100 transmits to the client device 60 over the communication channel 50.

In various implementations, the data source 30 generates a data stream 32 that includes various source packets 34 (e.g., data packets). In various implementations, a source packet 34 refers to a unit of data that is configured to traverse a communication channel 50. In some implementations, a source packet 34 is referred to as a payload. In various implementations, the data source 30 is associated with a communication system (e.g., a multimedia communication system such as an audio/video conferencing system, or an audio/video telephony system), and the source packets 34 represent information (e.g., audio/video) communicated over the communication system. In various implementations, the data source 30 is associated with a content store (e.g., a multimedia content store such as an On-Demand content store), and the source packets 34 represent content from the content store (e.g., multimedia content such as movies, TV shows, podcasts, etc.). In various implementations, the data source 30 provides the data stream 32 in response to receiving a request (e.g., from the client device 60). In various implementations, the data stream 32 is encrypted. As such, in various implementations, the source packets 34 are encrypted.

In various implementations, the encoding unit 100 performs one or more encoding operations with the data stream 32 to generate the encoded data stream 132. In various implementations, the encoded data stream 132 includes the source packets 34 and parity packets 134. In various implementations, the encoding unit 100 includes (e.g., generates and/or stores) an encoding structure 122 (e.g., a code structure) that includes several encoding patterns 124 (e.g., a first encoding pattern 124-1, a second encoding pattern 124-2 . . . an nth encoding pattern 124-N). In various implementations, the encoding unit 100 utilizes the encoding structure 122 to perform the encoding operation(s) on the data stream 32 and generate the encoded data stream 132. In various implementations, the encoding unit 100 utilizes the encoding patterns 124 to synthesize the parity packets 134. For example, in some implementations, the encoding unit 100 utilizes the first encoding pattern 124-1 to synthesize a first set of parity packets 134 and the second encoding pattern 124-2 to synthesize a second set of parity packets 134. In various implementations, the client device 60 utilizes one or more parity packets 134 to repair/restore/rebuild/reconstruct one or more damaged/lost/dropped/corrupted source packets 34.

In various implementations, the encoding unit 100 determines a channel characterization vector 52 that characterizes the communication channel 50. In various implementations, the channel characterization vector 52 indicates one or more characteristics of the communication channel 50. In some implementations, the channel characterization vector 52 indicates a state/condition/quality of the communication channel 50. For example, in some implementations, the channel characterization vector 52 indicates whether the communication channel 50 is bursty. In some implementations, the number of source packets 34 transmitted by the communication channel 50 at a given time indicates whether the communication channel 50 is bursty. In some examples, the communication channel 50 is considered bursty if the communication channel 50 frequently transmits more than a threshold number of source packets 34 concurrently. In some implementations, the channel characterization vector 52 indicates whether the communication channel 50 is susceptible to burst losses in breach of a threshold (e.g., threshold burst losses). In other words, in some implementations, the channel characterization vector 52 indicates whether the communication channel 50 is associated with burst losses that violate a threshold. In some examples, the channel characterization vector 52 indicates that the communication channel 50 is susceptible to burst losses in breach of a threshold in response to determining that a number/percentage of burst losses exceeds the threshold.

In some implementations, the channel characterization vector 52 indicates a data loss rate of the communication channel 50. In some examples, the data loss rate is a function of the number of source packets 34 that the communication channel 50 drops during transmission. In some implementations, the channel characterization vector 52 indicates a data corruption rate of the communication channel 50. In some examples, the data corruption rate is a function of the number of source packets 34 that get corrupted during transmission. More generally, in various implementations, the channel characterization vector 52 indicates channel statistics. In some implementations, the channel characterization vector 52 indicates a channel type (e.g., fiber optic, Ethernet, cellular, satellite, TCP/IP, etc.). In some implementations, the channel characterization vector 52 indicates a noise level of the communication channel 50. In some implementations, the channel characterization vector 52 indicates a noise type (e.g., a noise color such as white noise, pink noise, blue noise, etc.).

In various implementations, the encoding unit 100 determines the encoding structure 122 as a function of the channel characterization vector 52. For example, in various implementations, the encoding unit 100 selects one or more encoding patterns 124 as a function of the channel characterization vector 52. In some implementations, the encoding unit 100 utilizes different encoding patterns 124 to synthesize different parity packets 134 based on the channel characterization vector 52. For example, in some implementations, the encoding unit 100 alternates between different encoding patterns 124 to synthesize alternating parity packets 134. For example, the encoding unit 100 utilizes the first encoding pattern 124-1 to synthesize a first set of parity packets 134, and the encoding unit 100 utilizes the second encoding pattern 124-2 to synthesize a second set of parity packets 134. In some implementations, the encoding unit 100 alternates between different encoding patterns 124 in response to the channel characterization vector 52 satisfying a threshold characteristic. For example, the encoding unit 100 alternates between different encoding patterns 124 in response to the channel characterization vector 52 indicating that the communication channel 50 is susceptible to burst losses in breach of a threshold, more lossy than a threshold data loss rate, and/or more noisy than a threshold noise level. In various implementations, the encoding structure 122 and/or the encoding patterns 124 are media-agnostic. In other words, in various implementations, the encoding structure 122 and/or the encoding patterns 124 operate independent of the information conveyed by the source packets 34. As such, in various implementations, the encoding structure 122 and/or the encoding patterns 124 synthesize the encoded data stream 132 even when the data stream 32 is encrypted, and the encoding structure 122 and/or the encoding patterns 124 are unable to determine the relative importance of the source packets 34.

In various implementations, the client device 60 receives the encoded data stream 132 over the communication channel 50. In some implementations, the client device 60 receives the encoded data stream 132 in response to transmitting a request. For example, in some implementations, the client device 60 receives the encoded data stream 132 in response to requesting multimedia content. In some implementations, the client device 60 receives the encoded data stream 132 in response to participating (e.g., initiating/joining) in a conference call (e.g., an audio/video conference call). In some implementations, the client device 60 receives the encoded data stream 132 in response to participating (e.g., initiating/accepting) in an audio/video telephonic communication. In various implementations, the client device 60 includes a FEC decoding unit 62 ("decoding unit 62", hereinafter for the sake of brevity). In some implementations, the decoding unit 62 utilizes the parity packets 134 to recover sources packets 34 that were dropped by the communication channel 50. More generally, in various implementations, the decoding unit 62 utilizes the parity packets 134 to repair/restore/reconstruct/rebuild source packets 34 that were corrupted/damaged/lost/dropped during transmission.

In various implementations, the client device 60 includes any suitable computing device, such as a computer, a laptop computer, a tablet device, a netbook, an internet kiosk, a personal digital assistant, a mobile phone, a smartphone, a wearable, a gaming device, a computer server, etc. In some implementations, the client device 60 includes one or more processors, one or more types of memory (e.g., a non-transitory memory), a display and/or other user interface components such as a keyboard, a touchscreen, a mouse, a track-pad, a digital camera and/or any number of supplemental devices to add functionality. In some implementations, a client device 60 includes a suitable combination of hardware, software and firmware configured to provide at least some of protocol processing, modulation, demodulation, data buffering, power control, routing, switching, clock recovery, amplification, decoding, and error control.

In various implementations, the data source 30 includes any suitable computing device, such as a server, a computer, a laptop computer, a tablet device, a netbook, an internet kiosk, a personal digital assistant, a mobile phone, a smartphone, a wearable, a gaming device, a computer server, etc. In some implementations, the data source 30 includes one or more processors, one or more types of memory (e.g., a non-transitory memory), a display and/or other user interface components such as a keyboard, a touchscreen, a mouse, a track-pad, a digital camera and/or any number of supplemental devices to add functionality. In some implementations, the data source 30 includes a suitable combination of hardware, software and firmware configured to provide at least some of protocol processing, modulation, demodulation, data buffering, power control, routing, switching, clock recovery, amplification, decoding, and error control.

In various implementations, the communication channel 50 includes any suitable communication medium. For example, in some implementations, the communication channel 50 includes portions of a public network (e.g., the Internet), and/or portions of a private network. In various implementations, the communication channel 50 includes one or more type of communication cables (e.g., fiber optic, Ethernet, etc.). In various implementations, the communication channel 50 utilizes one or more communication protocols (e.g., TCP/IP). In various implementations, the communication channel 50 includes portions of a wired network (e.g., Ethernet), and/or portions of a wireless network (e.g., Wi-Fi, Bluetooth, cellular, etc.). In some implementations, the communication channel 50 includes multiple communication channels (not shown). In some such implementations, each communication channel 50 is associated with a corresponding channel characterization vector 52. In such implementations, the data source 30 and/or the encoding unit 100 transmits the encoded data stream 132 on one or more of the numerous communication channels based on the channel characteristics indicated by the corresponding channel characterization vector 52.

Figure 2:
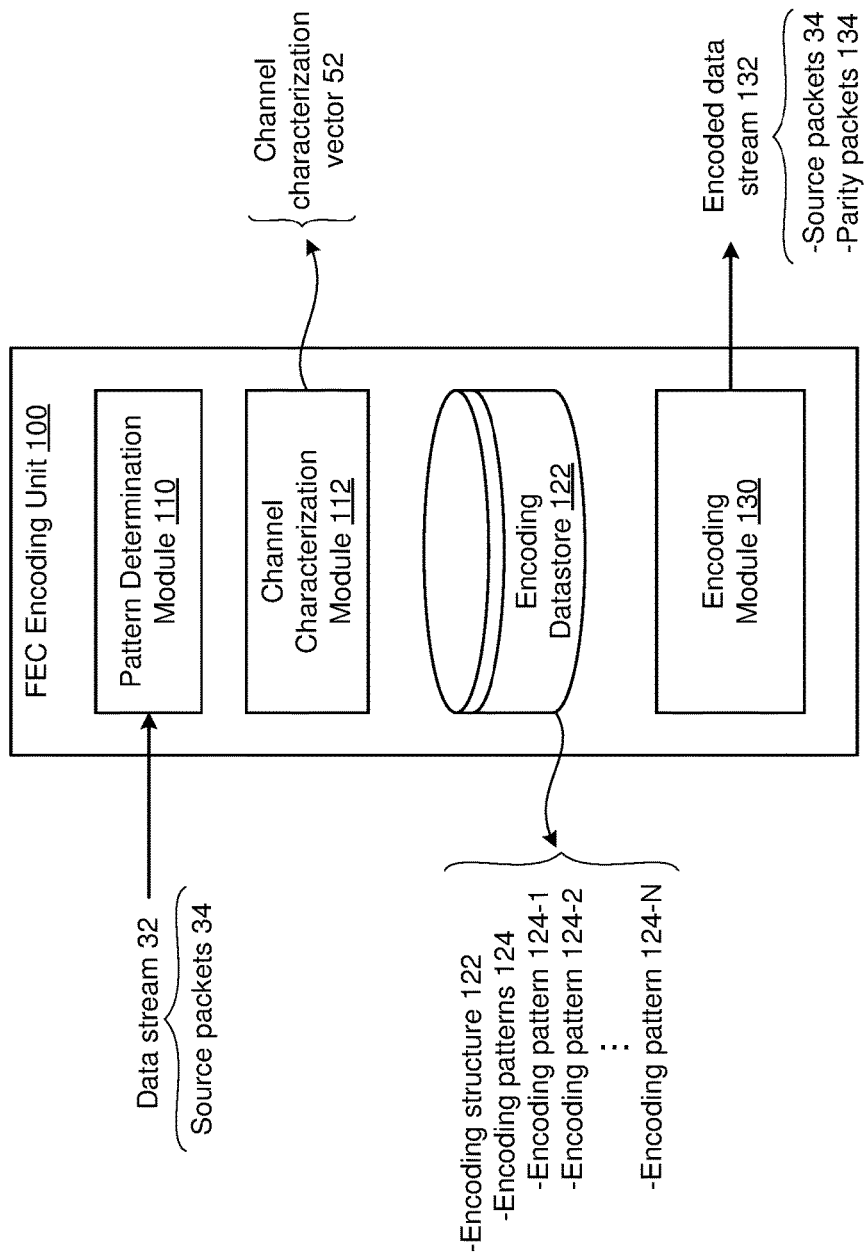
FIG. 2 is a block diagram of an encoding unit in accordance with some implementations.

FIG. 2 is a block diagram of the encoding unit 100 in accordance with some implementations. In various implementations, the encoding unit 100 includes a pattern determination module 110, a channel characterization module 112, an encoding datastore 122, and an encoding module 130. Briefly, in various implementations, the encoding datastore 122 includes an encoding structure 122 with several encoding patterns 124, the channel characterization module 112 determines a channel characterization vector 52, the pattern determination module 110 selects one or more encoding patterns 124 as a function of the channel characterization vector 52, and the encoding module 130 utilizes the selected encoding pattern(s) 124 to encode the data stream 32 in order to synthesize the encoded data stream 132.

In various implementations, the encoding datastore 122 includes (e.g., stores) the encoding structure 122. For example, in some implementations, the encoding unit 100 receives the encoding structure 122 from an external source (e.g., a system administrator), and the encoding unit 100 stores the encoding structure 122 in the encoding datastore 122. In various implementations, the encoding structure 122 includes several encoding patterns 124 (e.g., the first encoding pattern 124-1, the second encoding pattern 124-2 . . . the nth encoding pattern 124-N). In various implementations, an encoding pattern 124 indicates a particular encoding operation. In various implementations, an encoding pattern 124 indicates a function that relates a parity packet 134 to one or more source packets 34. In other words, in various implementations, an encoding pattern 124 indicates the dependency of a parity packet 134 on one or more source packets 34. In various implementations, the encoding structure 122 and/or the encoding patterns 124 includes a convolution code. In various implementations, the encoding datastore 122 includes a non-transitory memory (e.g., a storage device such as an optical storage device, a hard disk, etc.).

In various implementations, the channel characterization module 112 determines the channel characterization vector 52. In various implementations, the channel characterization module 112 determines one or more characteristics (e.g., a state/condition/quality) of the communication channel 50, and the channel characterization vector 52 indicates the characteristic(s) of the communication channel 50. In various implementations, the channel characterization module 112 determines channel statistics associated with the communication channel 50, and the channel characterization vector 52 indicates the channel statistics associated with the communication channel 50. In various implementations, the channel characterization module 112 determines whether the communication channel 50 is bursty (e.g., whether data transmissions over the communication channel 50 are bursty and/or whether data losses associated with the communication channel 50 are bursty), and the channel characterization vector 52 indicates whether the communication channel 50 is bursty. For example, in some implementations, the channel characterization module 112 determines a percentage of long bursts (e.g., transmissions with more than a threshold number of source packets 34). In some implementations, the percentage of long bursts indicates whether the data transmissions over the communication channel 50 are bursty. In such implementations, the channel characterization vector 52 indicates whether the data transmissions over the communication channel 50 are bursty (e.g., by indicating the percentage of long bursts).

In some implementations, the channel characterization module 112 determines a percentage of sequential data losses (e.g., a percentage of losses in which source packets 34 that occur in a sequence are lost). In some implementations, the percentage of sequential data losses indicates whether the data losses associated with the communication channel 50 are bursty. In such implementations, the channel characterization vector 52 indicates whether the data losses associated with the communication channel 50 are bursty (e.g., by indicating the percentage of sequential data losses). In some implementations, the channel characterization module 112 determines whether the communication channel 50 is susceptible to burst losses in breach of a threshold. In such implementations, the channel characterization vector 52 indicates whether the communication channel 50 is susceptible to burst losses in breach of a threshold. In other words, in some implementations, the channel characterization module 112 determines whether the communication channel 50 is associated with burst losses that violate (e.g., exceed) a threshold. In such implementations, the channel characterization vector 52 indicates whether the communication channel 50 is associated with burst losses that violate a threshold.

In various implementations, the channel characterization module 112 determines a data loss rate (e.g., a packet drop rate) of the communication channel 50, and the channel characterization vector 52 indicates the data loss rate. For example, in some implementations, the channel characterization module 112 determines a percentage of source packets 34 that the communication channel 50 receives from the encoding unit 100 but does not deliver to the client device 60. In various implementations, the channel characterization module 112 determines a type of the communication channel 50, and the channel characterization vector 52 indicates the type of the communication channel 50. For example, in some implementations, the channel characterization vector 52 indicates whether the communication channel 50 includes portions of fiber optic, Ethernet, cellular, satellite, TCP/IP, and/or other communication mediums. In various implementations, the channel characterization module 112 determines a noise level of the communication channel 50, and the channel characterization vector 52 indicates the noise level of the communication channel 50. In various implementations, the channel characterization module 112 determines a type of noise in the communication channel 50, and the channel characterization vector 52 indicates the type of noise in the communication channel 50.

In various implementations, the pattern determination module 110 selects a portion of the encoding structure 122 to encode the data stream 32 as a function of the channel characterization vector 52. In various implementations, the pattern determination module 110 selects one or more encoding patterns 124 (e.g., the first encoding pattern 124-1 and/or the second encoding pattern 124-2) to synthesize the parity packets 134 as a function of the channel characterization vector 52. For example, in some implementations, the pattern determination module 110 selectively alternates between different encoding patterns 124 in response to the channel characterization vector 52 satisfying a threshold characteristic. In some examples, the pattern determination module 110 selectively alternates between different encoding patterns 124 based on a function of a characteristic (e.g., burst losses, data loss rate, data corruption rate, channel type, noise level, noise type, etc.) of the communication channel 50 in relation to the threshold characteristic (e.g., threshold burst losses, threshold data loss rate, threshold data corruption rate, threshold channel type, threshold noise level, threshold noise type, etc.). For example, the pattern determination module 112 selectively alternates between the first encoding pattern 124-1 and the second encoding pattern 124-2 in response to the channel characterization vector 52 indicating that a characteristic of the communication channel 50 is greater than a threshold characteristic.

In various implementations, the encoding module 130 synthesizes the encoded data stream 132. In various implementations, the encoding module 130 performs one or more encoding operations in accordance with the selected encoding pattern(s) 124 to synthesize the parity packets 134 as a function of the source packets 34. For example, in some implementations, the encoding module 130 determines (e.g., identifies) a set of source packets 34 indicated by the selected encoding pattern 124, and synthesizes a set of one or more parity packets 134 based on the set of source packets 34. A person of ordinary skill in the art will appreciate that, in various implementations, the encoding module 130 utilizes a variety of systems, methods and/or processes to synthesize the parity packets 134. For example, a person of ordinary skill in the art will appreciate that, in various implementations, the encoding module 130 utilizes a variety of encoding systems, methods, processes and/or techniques associated with FEC to synthesize the parity packets 134. For example, in some implementations, the encoding module 130 synthesizes the parity packet 134 via random linear combinations of several source packets 34.

In various implementations, the encoding unit 100 is media syntax agnostic. In other words, in various implementations, the encoding unit 100 synthesizes the encoded data stream 132 (e.g., the parity packets 134) without determining the relative importance of source packets 34 in the data stream 32. In some implementations, the data stream 32 and/or the source packets 34 are associated with audio conferencing. In such implementations, the encoding unit 100 improves the probability of recovering lost/damaged/corrupted source packets 34 by protecting source packets 34 with odd sequence numbers differently than source packets 34 with even sequence numbers. For example, in such implementations, the encoding unit 100 utilizes the first encoding pattern 124-1 for odd-numbered source packets 34 and the second encoding pattern 124-2 for even-numbered source packets 34. In various implementations, the encoding unit 100 utilizes the techniques, methods and/or systems described herein for other types of media such as video. For example, in some implementations, the data stream 32 corresponds with a video. Since the loss of consecutive video slices (e.g., spatially and/or temporally) is more noticeable to a user of the client device 60, the encoding unit 100 tends to improve user experience by reducing the likelihood of losing multiple consecutive video slices.

In various implementations, the encoding unit 100 reduces the residual packet loss rate by alternating between different encoding patterns 124. For example, in some implementations, the encoding unit 100 reduces the residual packet loss rate by utilizing the first encoding pattern 124-1 to protect the odd-numbered source packets 34 and by utilizing the second encoding pattern 124-2 to protect the even-numbered source packets 34. In some implementations, the encoding unit 100 reduces the residual packet loss rate by protecting odd-numbered source packets 34 and by not protecting the even-numbered source packets 34. More generally, in various implementations, the encoding unit 100 reduces the residual packet loss rate by providing unequal error protection to different source packets 34. For example, in some implementations, the encoding unit 100 provides a first type/level of error protection to odd-numbered source packets 34 and a second type/level of error protection to even-numbered source packets 34.

In various implementations, the encoding unit 100 improves the perceptual measure of speech quality (PESQ) for media (e.g., a VoIP application) with audio (e.g., Opus encoded audio). For example, in some implementations, the encoding unit 100 improves the PESQ by utilizing the first encoding pattern 124-1 to protect the odd-numbered source packets 34 and by utilizing the second encoding pattern 124-2 to protect the even-numbered source packets 34. In some implementations, the encoding unit 100 improves the PESQ by protecting odd-numbered source packets 34 and by not protecting the even-numbered source packets 34. More generally, in various implementations, the encoding unit 100 improves the PESQ by providing unequal error protection to different source packets 34. For example, in some implementations, the encoding unit 100 provides a first type/level of error protection to odd-numbered source packets 34 and a second type/level of error protection to even-numbered source packets 34.

In some implementations, data loss in a network (e.g., the communication channel 50) increases as the percentage of long bursts increases. In such implementations, a number of occasions in which full FEC recovery is unfeasible tends to increase. In some such implementations, the encoding unit 100 protects odd-numbered source packets 34 and does not protect even-numbered source packets 34 in order to reduce the residual packet loss rate and/or improve the PESQ. In various implementations, the encoding unit 100 protects odd-numbered source packets 34 to a greater degree than even-numbered source packets 34. In various implementations, providing unequal protection leads to loss patterns with alternating losses rather than burst losses. As such, in various implementations, the encoding unit 100 tends to provide greater concealment for residual loss pattern by alternating between different encoding patterns 124.

In various implementations, the encoding unit 100 provides more protection for even-numbered source packets 34 than odd-numbered source packets 34. For example, in some implementations, the encoding unit 100 provides protection for even-numbered source packets 34 and does not provide protection for odd-numbered source packets 34. In such implementations, the probability of recovering even-numbered source packets 34 increases. In some implementations, the encoding unit 100 provides more protection for even-numbered source packets 34 when the communication channel 50 is susceptible to burst losses in breach of a threshold. In some implementations, the encoding unit 100 provides more protection for even-numbered source packets 34 when a data loss rate of the communication channel 50 breaches a function of a threshold data loss rate (e.g., the data loss rate of the communication channel 50 is greater than the threshold data loss rate). A person of ordinary skill in the art will appreciate from the present disclosure that the encoding structure 122 is malleable and suitable for adaptive error protection.

Figure 3:
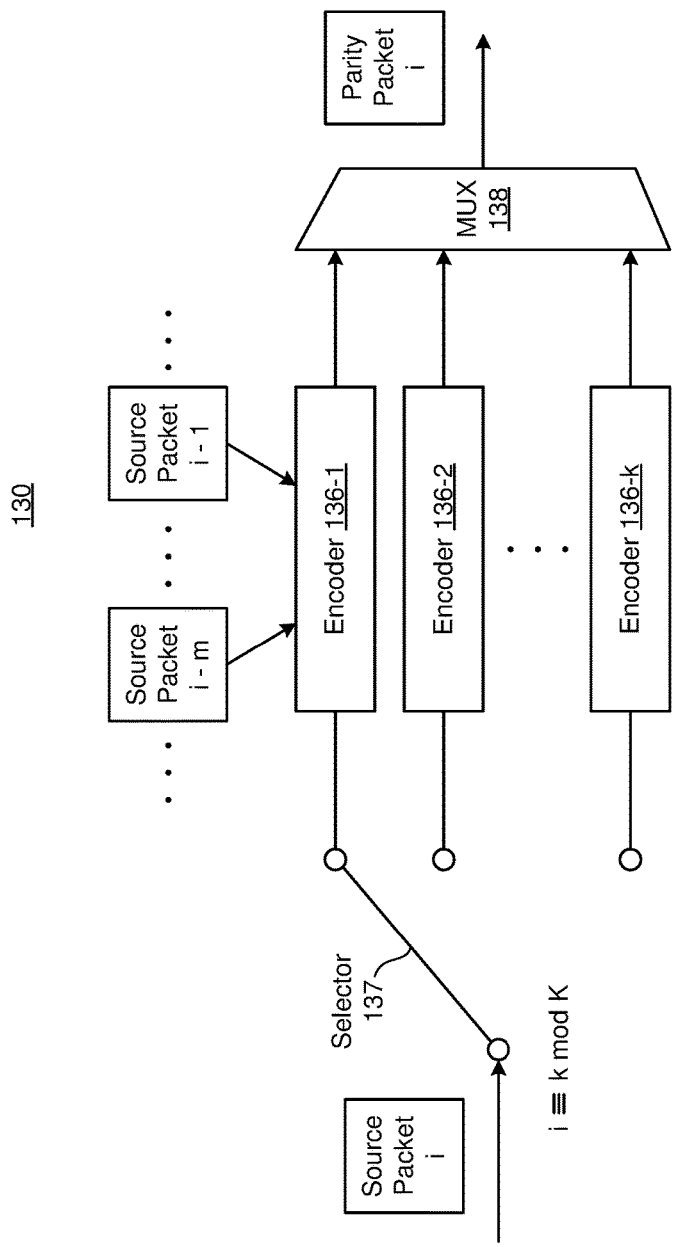
FIG. 3 is a block diagram of an encoding module that includes various encoders in accordance with some implementations.

FIG. 3 is a block diagram of an encoding module 130 in accordance with some implementations. In various implementations, the encoding module 130 includes encoders 136 (e.g., a first encoder 136-1, a second encoder 136-2 ... a kth encoder 136-k). In various implementations, an encoder 136 synthesizes a set of one or more parity packets 134 as a function of a set of source packets 34. In various implementations, an encoder 136 is associated with an encoding pattern 124. In such implementations, the encoder 136 synthesizes the set of one or more parity packets 134 in accordance with the encoding pattern 124 associated with the encoder 136. In other words, in various implementations, an encoder 136 synthesizes the set of one or more parity packets 134 by performing one or more encoding operations in accordance with the encoding pattern 124 associated with the encoder 136. In some implementations, the encoding pattern 124 associated with the encoder 136 indicates a set of source packets 34 for the encoder 136 to utilize in order to synthesize a parity packet 136. In such implementations, the encoder 136 utilizes the set of source packets 34 indicated by the encoding pattern 124 to synthesize the parity packet 136. In other words, in some implementations, the encoder 136 synthesizes a parity packet 136 that is a function of (e.g., that depends on) a set of source packets 34 indicated by the encoding pattern 124 associated with the encoder 136. Put another way, in some implementations, the encoders 136 operate on a set of source packets 34 that are within a window. In such implementations, an encoder 136 utilizes (e.g., applies) its corresponding encoding pattern 124 to the set of source packets 34 that are within the window. As such, in some implementations, various encoders 136 (e.g., all encoders 136) apply their corresponding encoding patterns 124 to the same window of source packets 34.

In various implementations, the encoding module 130 includes a selector 137 (e.g., a switch, for example, a switching circuit/logic) and a multiplexer 138. In various implementations, the multiplexer 138 is connected with outputs of the encoders 136. In various implementations, the selector 137 selects (e.g., activates) a subset of the encoders 136, and the multiplexer 138 forwards the output(s) of the selected encoder(s) 136. For example, in some implementations, the selector 137 selects one of the encoders 136 (e.g., the first encoder 136-1). In various implementations, the selector 137 alternates between selecting different encoders 136. For example, in some implementations, the selector 137 alternates between selecting the first encoder 136-1 and the second encoder 136-2. In various implementations, the multiplexer 138 forwards (e.g., transmits) the output(s) of the selected encoder(s) 136 to the client device 60 shown in FIG. 1.

Figure 4:
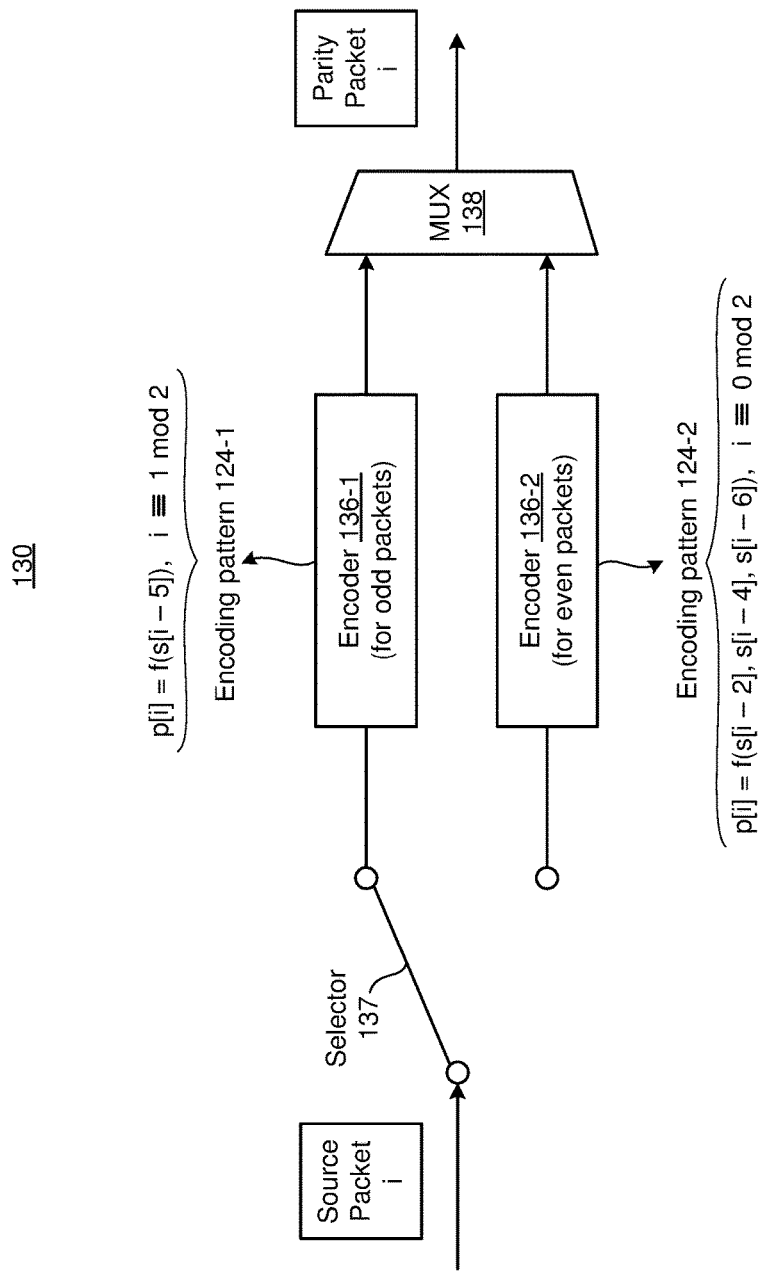
FIG. 4 is a block diagram of an encoding module that includes several encoders in accordance with some implementations.

FIG. 4 is a block diagram of an encoding module 130 in accordance with some implementations. In the example of FIG. 4, the encoding module 130 includes two encoders 136: the first encoder 136-1 and the second encoder 136-2. As illustrated in FIG. 4, the first encoder 136-1 is associated with the first encoding pattern 124-1, and the second encoder 136-2 is associated with the second encoding pattern 124-2. In the example of FIG. 4, the first encoder 136-1 synthesizes the parity packet i in response to the source packet i being an odd-numbered packet (e.g., an odd-sequenced packet) in a sequence of source packets. In the example of FIG. 4, the second encoder 136-2 synthesizes the parity packet i in response to the source packet i being an even-numbered packet (e.g., an even-sequenced packet) in the sequence of source packets. As illustrated in FIG. 4, the first encoding pattern 124-1 represents a first function that indicates a dependency of the parity packet i on source packet i-5. Similarly, the second encoding pattern 124-2 represents a second function that indicates a dependency of the parity packet i on source packets i-2, i-4 and i-6.

In various implementations, the selector 137 selects the first encoder 136-1, and the multiplexer 138 transmits (e.g., forwards) the output of the first encoder 136-1 in response to the source packet i being an odd-numbered packet in a sequence of source packets. In various implementations, the selector 137 selects the second encoder 136-2, and the multiplexer 138 transmits (e.g., forwards) the output of the second encoder 136-2 in response to the source packet i being an even-numbered packet in the sequence of source packets. As illustrated in FIG. 4, the first and second encoders 136-1, 136-2 provide unequal error protection for the source packets 34. In various implementations, providing unequal error protection for different source packets 34 improves the probability of a partial recovery when a full recovery is not feasible. In other words, in various implementations, providing unequal error protection decreases the probability of partial-recovery failure when a full recovery is not feasible. As such, in various implementations, the encoding unit 100 (e.g., the encoding module 130 with the first and second encoders 136-1, 136-2) provides a graceful degradation in recovery performance (e.g., instead of an abrupt degradation in recovery performance).

Figure 5A:
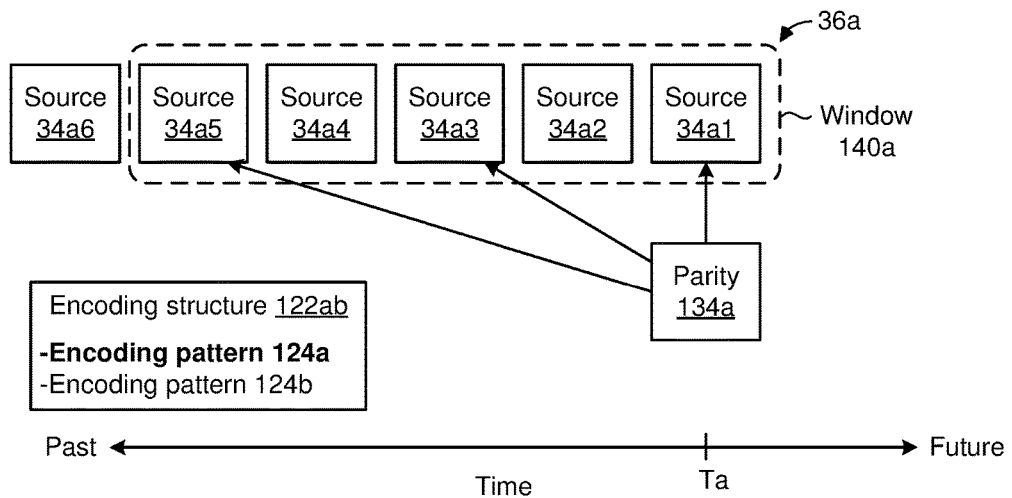
FIGS. 5A-6B are diagrams that illustrate parity packets as a function of source packets in accordance with some implementations.
Figure 5B:
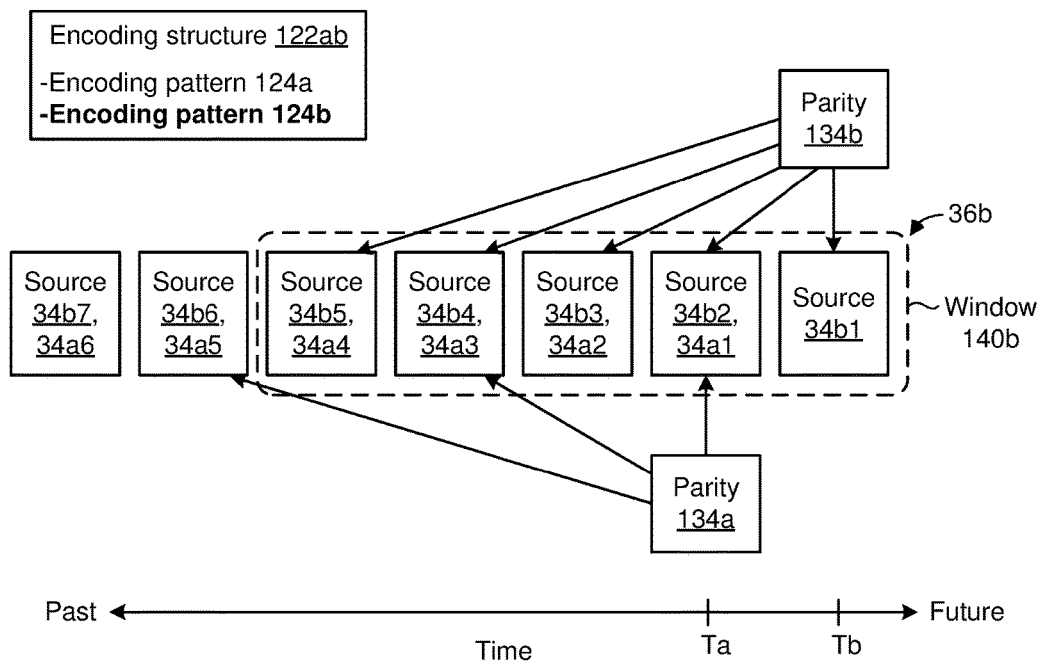

FIGS. 5A-5B are diagrams that illustrate the synthesis of parity packets 134 as a function of source packets 34 in accordance with some implementations. In the example of FIGS. 5A-B, the encoding unit 100 synthesizes the parity packets 134 in accordance with an encoding structure 122$ab$ that includes encoding patterns 124$a$ and 124$b$. As illustrated in FIG. 5A, the encoding unit 100 receives various source packets 34$a$1, 34$a$2 . . . 34$a$6. In various implementations, the encoding unit 100 determines a window 140$a$ that identifies a sequence 36$a$ of source packets 34$a$1, 34$a$2 . . . 34$a$5 that satisfy a windowing condition. In various implementations, the window 140$a$ includes a particular number (e.g., a predetermined number) of source packets 34. In the example of FIG. 5A, the window 140$a$ includes the five most recent source packets 34 (e.g., source packets 34$a$1 . . . 34$a$5). In such implementations, a source packet 34 is included in the sequence 36$a$ if the source packet 34 is within the window 140$a$ (e.g., if the source packet 34 is among the five most recent source packets 34). In the example of FIG. 5A, the encoding unit 100 synthesizes the parity packet 134$a$ in accordance with the encoding pattern 124$a$. As illustrated in FIG. 5A, in accordance with the encoding pattern 124$a$, the parity packet 134$a$ is a function of odd-numbered source packets 34$a$1, 34$a$3 and 34$a$5 in the sequence 36$a$. In the example of FIG. 5A, the encoding unit 100 synthesizes the parity packet 134$a$ at time Ta.

FIG. 5B illustrates the synthesis of parity packet 134$b$ at time Tb, which occurs after time Ta. As illustrated in FIG. 5B, the encoding unit 100 receives various source packets 34$b$1, 34$b$2 . . . 34$b$7. In the example of FIG. 5B, the encoding unit 100 determines a window 140$b$ that identifies a sequence 36$b$ of source packets 34$b$1 . . . 34$b$5. In some implementations, the encoding unit 100 determines the window 140$b$ by temporally sliding (e.g., temporally shifting/moving/translating/transposing) the window 140$a$. As such, in various implementations, the window 140$b$ includes the same number of source packets 34 as the window 140$a$. For example, the window 140$b$ includes the five most recent source packets 34 (e.g., source packets 34$b$1, 34$b$2 . . . 34$b$5). In the example of FIG. 5B, the encoding unit 100 synthesizes the parity packet 134$b$ in accordance with the encoding pattern 124$b$. As illustrated in FIG. 5B, in accordance with the encoding pattern 124$b$, the parity packet 134$b$ is a function of all source packets 34 in the sequence 36$b$. As illustrated in FIGS. 5A-B, the encoding structure 122$ab$ provides unequal error protection by synthesizing different parity packets 134 in accordance with different encoding patterns 124. As described herein, providing unequal error protection improves the probability of recovering one or more lost/damaged/corrupted source packets 34 when a full recovery is not feasible.

Figure 6A:
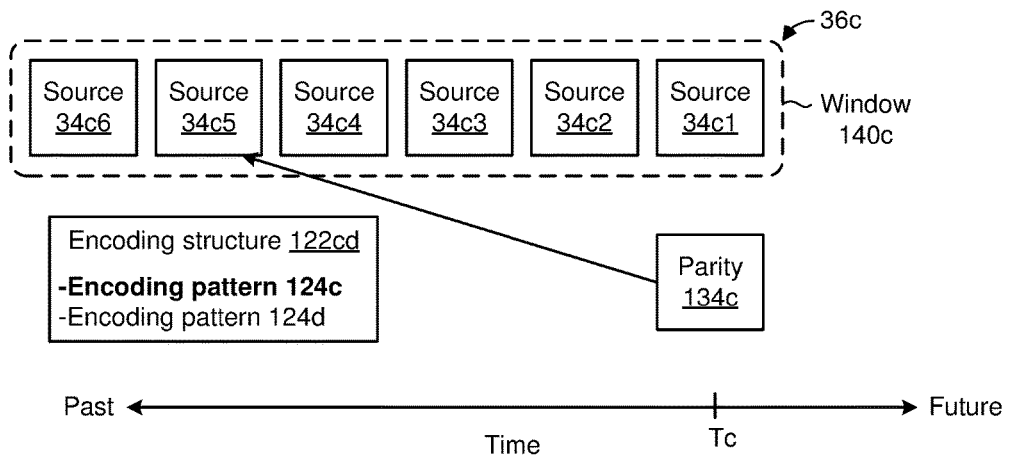
Figure 6B:
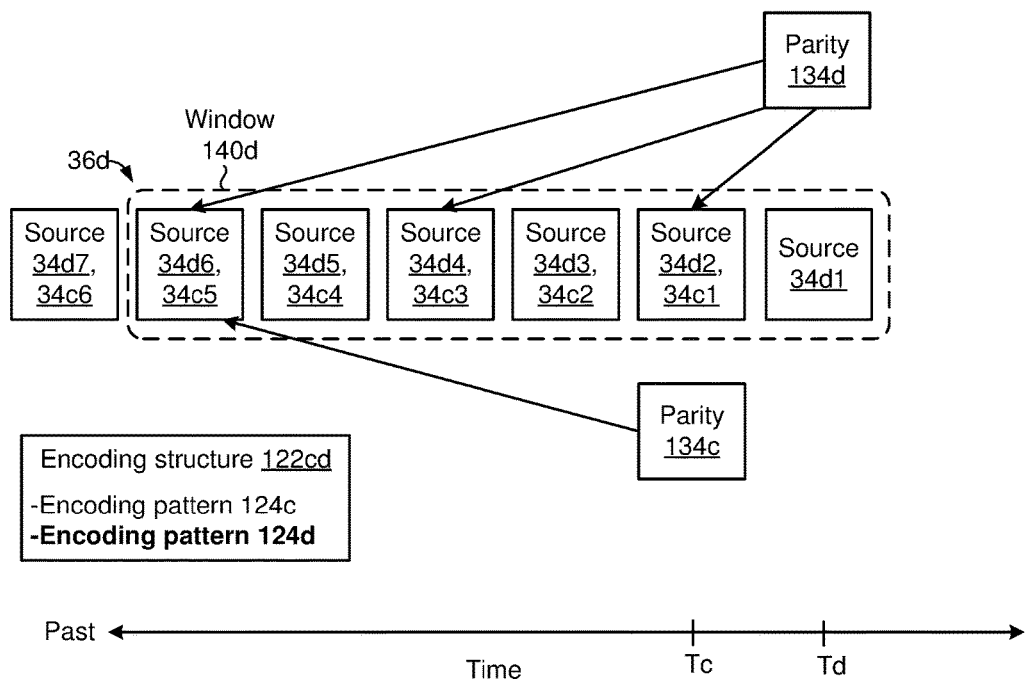

FIGS. 6A-6B are diagrams that illustrate the synthesis of parity packets 134 as a function of source packets 34 in accordance with some implementations. In the example of FIGS. 6A-B, the encoding unit 100 synthesizes the parity packets 134 in accordance with an encoding structure 122$cd$ that includes encoding patterns 124$c$ and 124$d$. As illustrated in FIG. 6A, the encoding unit 100 receives various source packets 34$c$1, 34$c$2 . . . 34$c$6. In various implementations, the encoding unit 100 determines a window 140$c$ that identifies a sequence 36$c$ of source packets 34$c$1, 34$c$2 . . . 34$c$6 that satisfy a windowing condition. In various implementations, the window 140$c$ includes a particular number (e.g., a predetermined number) of source packets 34. In the example of FIG. 6A, the window 140$c$ includes the six most recent source packets 34 (e.g., source packets 34$c$1 . . . 34$c$6). In such implementations, a source packet 34 is included in the window 140$c$ if the source packet 34 is among the six most recent source packets 34. In the example of FIG. 6A, the encoding unit 100 synthesizes the parity packet 134$c$ in accordance with the encoding pattern 124$c$. As illustrated in FIG. 6A, in accordance with the encoding pattern 124$c$, the parity packet 134$c$ is a function of a particular source packet 34$c$5 in the sequence 36$c$ (e.g., the fifth source packet 34$c$5 in the sequence 36$c$). In some implementations, the parity packet 134$c$ is a replica of the source packet 34$c$5. In the example of FIG. 6A, the encoding unit 100 synthesizes the parity packet 134$c$ at time Tc.

FIG. 6B illustrates the synthesis of parity packet 134$d$ at time Td, which occurs after time Tc. As illustrated in FIG. 6B, the encoding unit 100 receives various source packets 34$d$1, 34$d$2 . . . 34$d$7. In the example of FIG. 6B, the encoding unit 100 determines a window 140$d$ that identifies a sequence 36$d$ of source packets 34$d$1 . . . 34$d$6. In some implementations, the encoding unit 100 determines the window 140$d$ by temporally sliding the window 140$c$. As such, in various implementations, the window 140$d$ includes the same number of source packets 34 as the window 140$c$. For example, the window 140$d$ includes the six most recent source packets 34 (e.g., source packets 34$d$1, 34$d$2 . . . 34$d$6). In the example of FIG. 6B, the encoding unit 100 synthesizes the parity packet 134$d$ in accordance with the encoding pattern 124$d$. As illustrated in FIG. 6B, in accordance with the encoding pattern 124$d$, the parity packet 134$d$ is a function of three source packets 34 (e.g., the second, fourth and sixth source packets 34$d$2, 34$d$4, and 34$d$6) in the sequence 36$d$. As illustrated in FIGS. 6A-B, the encoding structure 122$cd$ provides unequal error protection by synthesizing different parity packets 134 in accordance with different encoding patterns 124. As described herein, providing unequal error protection improves the probability of recovering one or more lost/damaged/corrupted source packets 34 when a full recovery is not feasible. A person of ordinary skill in the art will appreciate that FIGS. 5A-6B illustrate non-zero dependencies of parity packets 134 on one or more source packets 34. Moreover, a person of ordinary skill in the art will appreciate that, in some implementations, the degree of the dependencies (e.g., non-zero coefficients that indicate the dependencies) are different.

Figure 7:
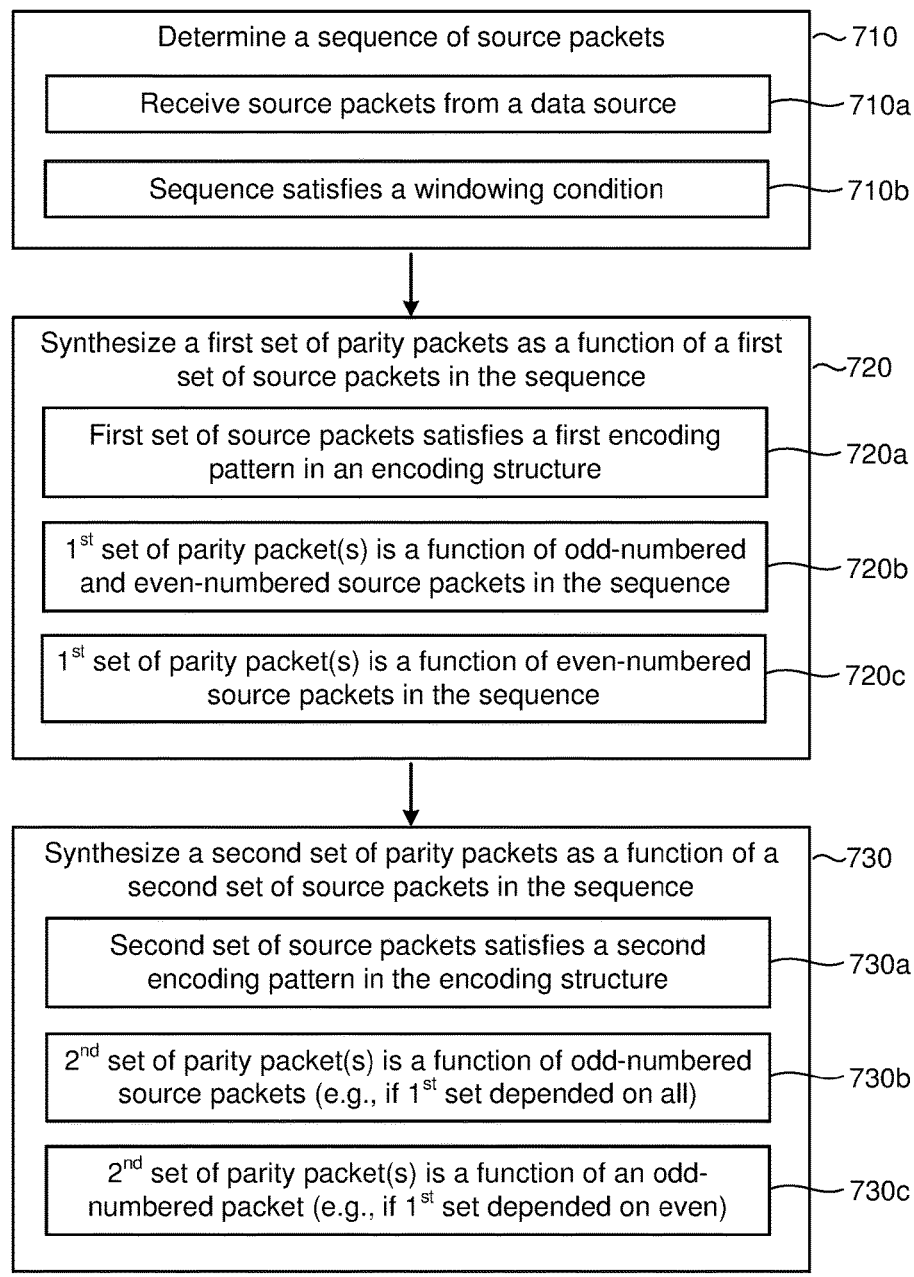
FIG. 7 is a flowchart representation of a method of synthesizing parity packets in accordance with some implementations.

FIG. 7 is a flowchart representation of a method 700 of synthesizing parity packets (e.g., parity packets 134 shown in FIGS. 1-6B) in accordance with some implementations. In various implementations, the method 700 is implemented as a set of computer readable instructions that are executed at an encoding unit (e.g., the encoding unit 100 shown in FIGS. 1-4). Briefly, the method 700 includes determining a sequence of source packets, synthesizing a first set of one or more parity packets as a function of a first set of source packets in the sequence, and synthesizing a second set of one or more parity packets as a function of a second set of source packets in the sequence.

As represented by block 710, in various implementations, the method 700 includes determining a sequence of source packets (e.g., the sequence 36a shown in FIG. 5A). As represented by block 710a, in various implementations, the method 700 includes receiving source packets from a data source (e.g., the data source 30 shown in FIG. 1). As represented by block 710b, in various implementations, determining the sequence includes determining source packets that satisfy a windowing condition. For example, in some implementations, the method 700 includes including a particular source packet in the sequence in response to that particular source packet being within a window (e.g., the window 140a shown in FIG. 5A). In some implementations, the method 700 includes temporally sliding (e.g., shifting/translating/transposing) the window to encapsulate the most recent source packet. In such implementations, determining the sequence of source packets includes selecting the source packets that are inside the window after the window is temporally slid (e.g., shifted/translated/transposed).

As represented by block 720, in various implementations, the method 700 includes synthesizing a first set of one or more parity packets (e.g., the parity packet 134a shown in FIG. 5A) as a function of a first set of source packets in the sequence (e.g., the source packets 34a1, 34a3 and 34a5). As represented by block 720a, in various implementations, the method 700 includes selecting the first set of source packets such that the first set satisfies a first encoding pattern of several encoding patterns in an encoding structure (e.g., the encoding pattern 124a of the encoding structure 122ab shown in FIG. 5A). In other words, in various implementations, the method 700 includes determining the first set of source packets by determining the source packets indicated by the first encoding pattern. As represented by block 720b, in various implementations, the method 700 includes synthesizing the first set of one or more parity packets as a function of odd-numbered source packets and even-numbered source packets in the sequence. In other words, in various implementations, the method 700 includes synthesizing the first set of one or more parity packets as a function of all the source packets in the window (e.g., synthesizing the parity packet 134b as a function of all the source packets 34 that are in the window 140b).

As represented by block 720c, in various implementations, the method 700 includes synthesizing the first set of one or more parity packets as a function of one or more even-numbered source packets (e.g., all the even-numbered source packets) in the sequence. In other words, in some implementations, the method 700 includes synthesizing the first set of one or more parity packets as a function of one or more even-numbered source packets in the window. In some implementations, the method 700 includes synthesizing the first set of one or more parity packets as a function of all the even-numbered source packets in the window (e.g., synthesizing the parity packet 134d as a function of the even-numbered source packets 34d2, 34d4 and 34d6 in the window 140d). Alternatively, in some implementations, the method 700 includes synthesizing the first set of one or more parity packets as a function of some of the even-numbered source packets in the window.

As represented by block 730, in various implementations, the method 700 includes synthesizing a second set of one or more parity packets (e.g., the parity packet 134b shown in FIG. 5B) as a function of a second set of source packets in the sequence (e.g., the source packets 34b1, 34b2 . . . 34b5). As represented by block 730a, in various implementations, the method 700 includes selecting the second set of source packets such that the second set satisfies a second encoding pattern of several encoding patterns in an encoding structure (e.g., the encoding pattern 124b of the encoding structure 122ab shown in FIG. 5B). In other words, in various implementations, the method 700 includes determining the second set of source packets by determining the source packets indicated by the second encoding pattern. As represented by block 730b, in various implementations, the method 700 includes synthesizing the second set of one or more parity packets as a function of odd-numbered source packets in the sequence (e.g., when the first set of one or more parity packets is a function of odd-numbered source packets and even-numbered source packets in the sequence). In other words, in various implementations, the method 700 includes synthesizing the second set of one or more parity packets as a function of the odd-numbered source packets in the window in response to determining that the first set of one or more parity packets is a function of odd-numbered and even-numbered source packets in the window (e.g., synthesizing the parity packet 134a as a function of the source packets 34a1, 34a3 and 34a5 that are in the window 140a).

As represented by block 730c, in various implementations, the method 700 includes synthesizing the second set of one or more parity packets as a function of one or more odd-numbered source packets in the sequence (e.g., when the first set of one or more parity packets is a function of one or more even-numbered source packets). In other words, in some implementations, the method 700 includes synthesizing the second set of one or more parity packets as a function of one or more odd-numbered source packets in the window (e.g., in response to determining that the first set of one or more parity packets is a function of one or more even-numbered source packets in a window). In some implementations, the method 700 includes synthesizing the second set of one or more parity packets as a function of a particular odd-numbered source packet in the window (e.g., the parity packet 134c shown in FIG. 6A is a function of source packet 34c5).

In various implementations, the method 700 includes selectively alternating between different encoding patterns of the encoding structure to synthesize different sets of parity packets. In some implementations, the method 700 includes determining to alternate between different encoding patterns as a function of a channel characterization vector. For example, in some implementations, the method 700 includes determining to alternate between different encoding patterns in response to the channel characterization vector indicating a channel characteristic that breaches a function of a threshold characteristic. In some examples, the method 700 includes determining to alternate between different encoding patterns in response to the channel characterization vector indicating that the communication channel is susceptible to burst losses in breach of a threshold. In some examples, the method 700 includes determining to alternate between different encoding patterns in response to the channel characterization vector indicating a channel data loss rate that breaches a function of a threshold data loss rate (e.g., the channel data loss rate exceeds the threshold data loss rate). More generally, in various implementations, the method 700 includes determining (e.g., selecting) the encoding structure and/or the encoding patterns as a function of the channel characterization vector.

In some implementations, the method 700 includes determining whether or not to synthesize the parity packet(s) based on a given encoding rate. For example, in some implementations, the given encoding rate is 1/2. In such implementations, the method 700 includes determining to synthesize the parity packet(s) for each source packet. In such implementations, the number of parity packets is the same as the number of source packets. In some implementations, the given encoding rate is 2/3. In such implementations, the method 700 includes determining to synthesize the parity packet(s) for every two source packets. In such implementations, the number of parity packets is different from (e.g., less than) the number of source packets. More generally, in various implementations, the method 700 includes determining an encoding rate (e.g., receiving the encoding rate), and determining whether or not to synthesize the parity packet(s) as a function of the encoding rate.

In various implementations, the method 700 includes transmitting an encoded data stream (e.g., the encoded data stream 132 shown in FIG. 1) that includes the source packets and the parity packets. In various implementations, the ratio of source packets to parity packets in the encoded data stream is a function of the encoding rate. For example, the number of parity packets in the encoded data stream is equal to the number of source packets in the encoded data stream when the encoding rate is 1/2. However, in some implementations, the number of parity packets in the encoded data stream is different from (e.g., less than) the number of source packets in the encoded data stream. For example, the number of parity packets in the encoded data stream is about half of the number of source packets in the encoded data stream when the encoding rate is 1/3.

Figure 8:
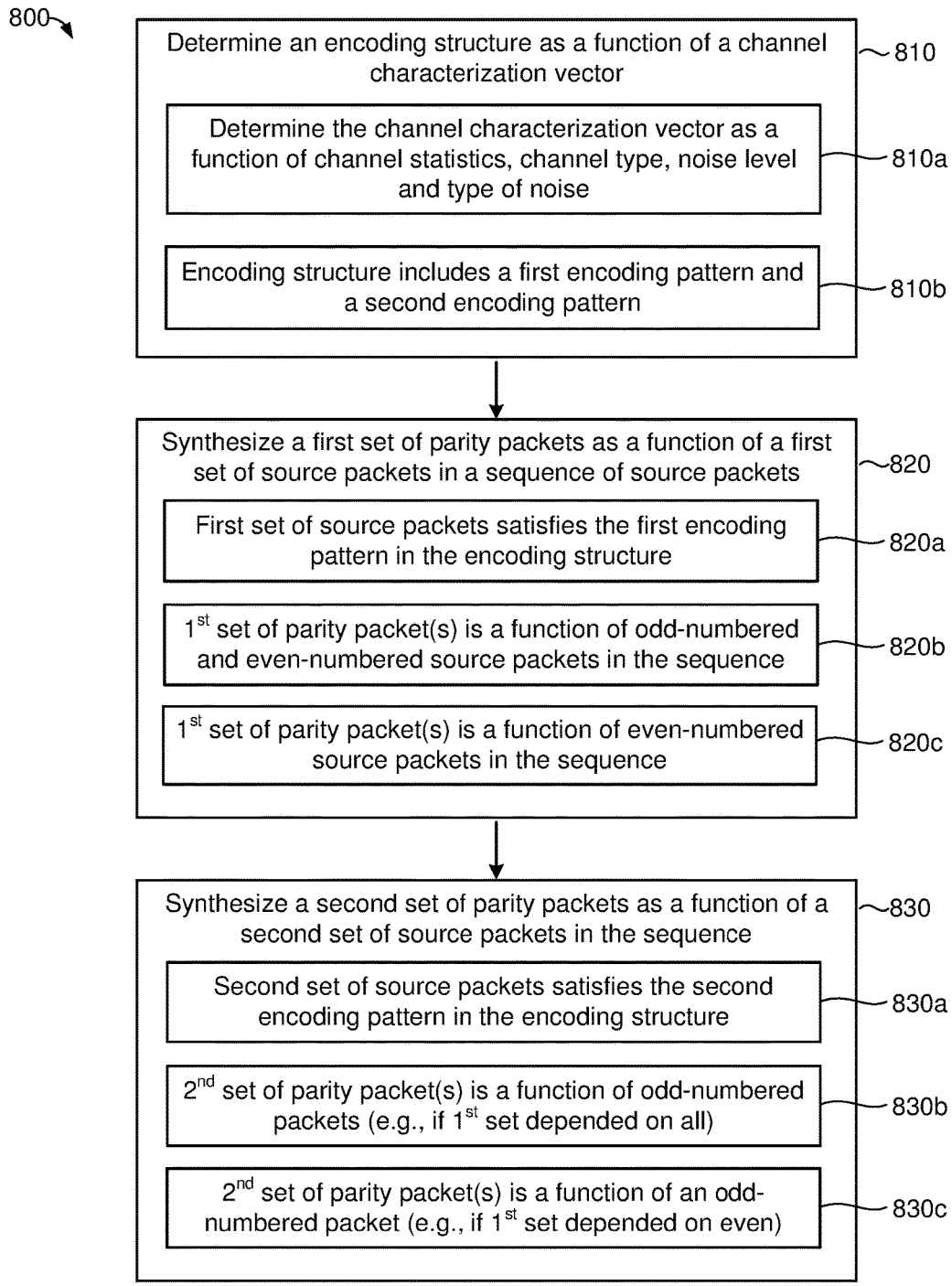
FIG. 8 is a flowchart representation of another method of synthesizing parity packets in accordance with some implementations.

FIG. 8 is a flowchart representation of a method 800 of synthesizing parity packets (e.g., parity packets 134 shown in FIGS. 1-6B) in accordance with some implementations. In various implementations, the method 800 is implemented as a set of computer readable instructions that are executed at an encoding unit (e.g., the encoding unit 100 shown in FIGS. 1-4). Briefly, the method 800 includes determining an encoding structure as a function of a channel characterization vector, synthesizing a first set of parity packets as a function of a first set of source packets in a sequence of source packets, and synthesizing a second set of parity packets as a function of a second set of source packets in the sequence.

As represented by block 810, in various implementations, the method 800 includes determining an encoding structure (e.g., the encoding structure 122 shown in FIG. 2) as a function of a channel characterization vector (e.g., the channel characterization vector 52 shown in FIG. 2). As represented by block 810a, in various implementations, the method 800 includes determining the channel characterization vector as a function of channel statistics, channel type, noise level and/or type of noise. In various implementations, the channel characterization vector indicates one or more characteristics of a communication channel. For example, in some implementations, the channel characterization vector indicates channel statistics such as whether the communication channel is susceptible to burst losses in breach of a threshold, a data loss rate of the communication channel, a data corruption rate of the communication channel, a latency of the communication channel, etc. In some implementations, the channel characterization vector indicates a channel type of the communication channel, a noise level in the communication channel, a noise type of a noise in the communication channel.

As represented by block 810b, in various implementations, the method 800 includes determining an encoding structure that includes several encoding patterns (e.g., the encoding patterns 124 shown in FIG. 2). In some implementations, the method 800 includes determining an encoding structure with two encoding patterns: a first encoding pattern and a second encoding pattern (e.g., the first encoding pattern 124-1 and the second encoding pattern 124-2 shown in FIG. 2). In various implementations, the method 800 includes determining an encoding structure with multiple encoding patterns in response to the channel characterization vector indicating a channel characteristic that breaches a function of threshold characteristic. For example, in some implementations, the method 800 includes determining an encoding structure with multiple encoding patterns in response to the channel characterization vector indicating that the communication channel is susceptible to burst losses in breach of a threshold. In some implementations, the method 800 includes determining an encoding structure with multiple encoding patterns in response to the channel characterization vector indicating a channel data loss rate that breaches a function of a threshold data loss rate (e.g., the channel data loss rate exceeds the threshold data loss rate).

As represented by block 820, in various implementations, the method 800 includes synthesizing a first set of one or more parity packets (e.g., the parity packet 134a shown in FIG. 5A) as a function of a first set of source packets in the sequence (e.g., the source packets 34a1, 34a3 and 34a5). As represented by block 820a, in various implementations, the method 800 includes selecting the first set of source packets such that the first set satisfies a first encoding pattern of several encoding patterns in an encoding structure (e.g., the encoding pattern 124a of the encoding structure 122ab shown in FIG. 5A). In other words, in various implementations, the method 800 includes determining the first set of source packets by determining the source packets indicated by the first encoding pattern. As represented by block 820b, in various implementations, the method 800 includes synthesizing the first set of one or more parity packets as a function of odd-numbered source packets and even-numbered source packets in the sequence. In other words, in various implementations, the method 800 includes synthesizing the first set of one or more parity packets as a function of all the source packets in the window (e.g., synthesizing the parity packet 134b as a function of all the source packets 34 that are in the window 140b).

As represented by block 820c, in various implementations, the method 800 includes synthesizing the first set of one or more parity packets as a function of one or more even-numbered source packets (e.g., all the even-numbered source packets) in the sequence. In other words, in some implementations, the method 800 includes synthesizing the first set of one or more parity packets as a function of one or more even-numbered source packets in the window. In some implementations, the method 800 includes synthesizing the first set of one or more parity packets as a function of all the even-numbered source packets in the window (e.g., synthesizing the parity packet 134d as a function of the even-numbered source packets 34d2, 34d4 and 34d6 in the window 140d). Alternatively, in some implementations, the method 800 includes synthesizing the first set of one or more parity packets as a function of some of the even-numbered source packets in the window.

As represented by block 830, in various implementations, the method 800 includes synthesizing a second set of one or more parity packets (e.g., the parity packet 134*b* shown in FIG. 5B) as a function of a second set of source packets in the sequence (e.g., the source packets 34*b*1, 34*b*2 . . . 34*b*5). As represented by block 830*a*, in various implementations, the method 800 includes selecting the second set of source packets such that the second set satisfies a second encoding pattern of several encoding patterns in an encoding structure (e.g., the encoding pattern 124*b* of the encoding structure 122*ab* shown in FIG. 5B). In other words, in various implementations, the method 800 includes determining the second set of source packets by determining the source packets indicated by the second encoding pattern. As represented by block 830*b*, in various implementations, the method 800 includes synthesizing the second set of one or more parity packets as a function of odd-numbered source packets in the sequence (e.g., when the first set of one or more parity packets is a function of odd-numbered source packets and even-numbered source packets in the sequence). In other words, in various implementations, the method 800 includes synthesizing the second set of one or more parity packets as a function of the odd-numbered source packets in the window in response to determining that the first set of one or more parity packets is a function of odd-numbered and even-numbered source packets in the window (e.g., synthesizing the parity packet 134*a* as a function of the source packets 34*a*1, 34*a*3 and 34*a*5 that are in the window 140*a*).

As represented by block 830*c*, in various implementations, the method 800 includes synthesizing the second set of one or more parity packets as a function of one or more odd-numbered source packets in the sequence (e.g., when the first set of one or more parity packets is a function of one or more even-numbered source packets). In other words, in some implementations, the method 800 includes synthesizing the second set of one or more parity packets as a function of one or more odd-numbered source packets in the window (e.g., in response to determining that the first set of one or more parity packets is a function of one or more even-numbered source packets in a window). In some implementations, the method 800 includes synthesizing the second set of one or more parity packets as a function of a particular odd-numbered source packet in the window (e.g., the parity packet 134*c* shown in FIG. 6A is a function of source packet 34*c*5).

In some implementations, the method 800 includes determining whether or not to synthesize the parity packet(s) based on a given encoding rate. For example, in some implementations, the given encoding rate is 1/2. In such implementations, the method 800 includes determining to synthesize the parity packet(s) for each source packet. In such implementations, the number of parity packets is the same as the number of source packets. In some implementations, the given encoding rate is 2/3. In such implementations, the method 800 includes determining to synthesize the parity packet(s) for every two source packets. In such implementations, the number of parity packets is different from (e.g., less than) the number of source packets. More generally, in various implementations, the method 800 includes determining an encoding rate (e.g., receiving the encoding rate), and determining whether or not to synthesize the parity packet(s) as a function of the encoding rate.

Figure 9:
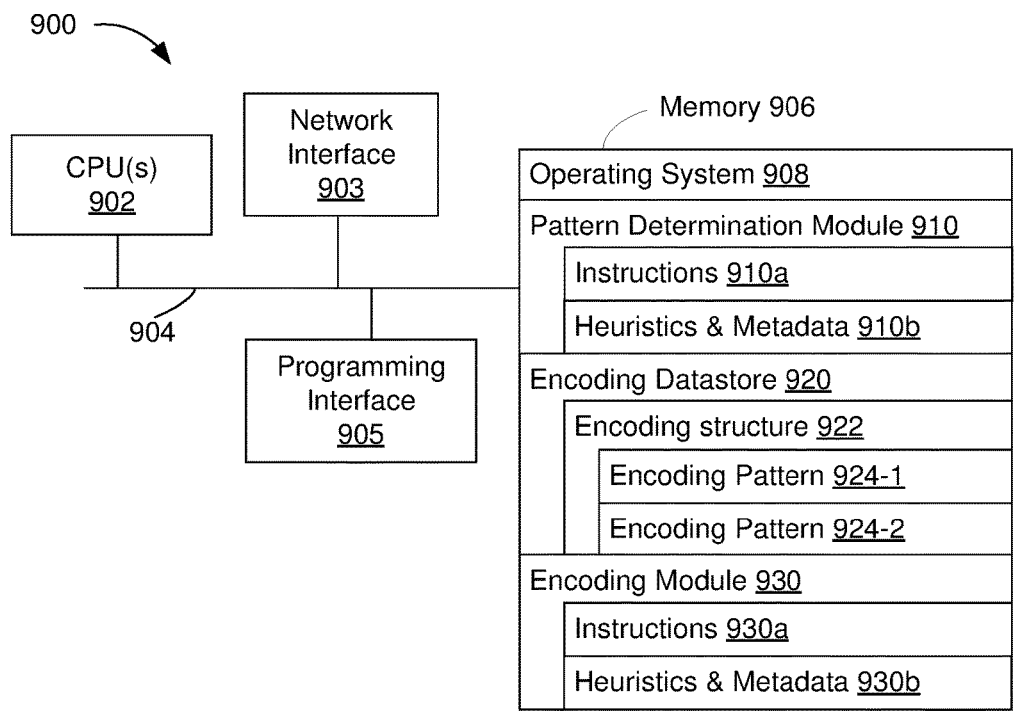
FIG. 9 is a block diagram of a server system enabled with various modules that are provided to synthesize parity packets in accordance with some implementations.

FIG. 9 is a block diagram of a server system 900 enabled with one or more components of an encoding unit (e.g., the encoding unit 100 shown in FIGS. 1 and 2) in accordance with some implementations. While certain specific features are illustrated, those of ordinary skill in the art will appreciate from the present disclosure that various other features have not been illustrated for the sake of brevity, and so as not to obscure more pertinent aspects of the implementations disclosed herein. To that end, as a non-limiting example, in some implementations the server system 900 includes one or more processing units (CPUs) 902, a network interface 903, a programming interface 905, a memory 906, and one or more communication buses 904 for interconnecting these and various other components.

In some implementations, the network interface 903 is provided to, among other uses, establish and maintain a metadata tunnel between a cloud hosted network management system and at least one private network including one or more compliant devices. In some implementations, the communication buses 904 include circuitry that interconnects and controls communications between system components. The memory 906 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. The memory 906 optionally includes one or more storage devices remotely located from the CPU(s) 902. The memory 906 comprises a non-transitory computer readable storage medium.

In some implementations, the memory 906 or the non-transitory computer readable storage medium of the memory 906 stores the following programs, modules and data structures, or a subset thereof including an optional operating system 908, a pattern determination module 910, an encoding datastore 920, and an encoding module 930. In various implementations, the pattern determination module 910, the encoding datastore 920 and the encoding module 930 are similar to the pattern determination module 110, the encoding datastore 120 and the encoding module 130, respectively, shown in FIG. 2. In various implementations, the encoding datastore 920 includes an encoding structure 922 that includes several encoding patterns 924 (e.g., a first encoding pattern 924-1 and a second encoding pattern 924-2). In various implementations, the encoding structure 922, the first encoding pattern 924-1 and the second encoding pattern 924-2 are similar to the encoding structure 122, the first encoding pattern 124-1 and the second encoding pattern 124-2, respectively, shown in FIG. 2.

In various implementations, the pattern determination module 910 selects the first encoding pattern 924-1. In such implementations, the encoding module 930 utilizes the first encoding pattern 924-1 to synthesize a first set of one or more parity packets as a function of a first set of source packets indicated by the first encoding pattern 924-1. In various implementations, the pattern determination module 910 selects the second encoding pattern 924-2. In such implementations, the encoding module 930 utilizes the second encoding pattern 924-2 to synthesize a second set of one or more parity packets as a function of a second set of source packets indicated by the second encoding pattern 924-2. To that end, the pattern determination module 910 includes instructions 910*a*, and heuristics and metadata 910*b*. In various implementations, the encoding module 930 includes instructions 930*a*, and heuristics and metadata 930*b*.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A method comprising:
   determining a sequence of source packets, wherein the sequence of source packets satisfies a windowing condition;
   synthesizing a first set of parity packets as a function of a first set of source packets in the sequence, wherein the first set of source packets satisfies a first encoding pattern; and
   synthesizing a second set of parity packets as a function of a second set of source packets in the sequence, wherein the second set of source packets satisfies a second encoding pattern that is different from the first encoding pattern, wherein each of the first encoding pattern and the second encoding pattern characterizes an encoding structure determined as a function of a channel characterization vector, and wherein each of the first encoding pattern and the second encoding pattern are selected based on the channel characterization vector to provide unequal protection for the source packets.

2. The method of claim 1, wherein synthesizing the first set of parity packets includes synthesizing the first set of parity packets as a function of odd-numbered source packets and even-numbered source packets in the sequence of the source packets.

3. The method of claim 2, wherein synthesizing the second set of parity packets includes synthesizing the second set of parity packets as a function of odd-numbered packets in the sequence of the source packets.

4. The method of claim 1, wherein synthesizing the first set of parity packets includes synthesizing the first set of parity packets as a function of even-numbered source packets in the sequence.

5. The method of claim 4, wherein synthesizing the second set of parity packets includes synthesizing the second set of parity packets as a function of odd-numbered source packets in the sequence.

6. The method of claim 1, further comprising:
   determining the channel characterization vector as a function of one or more of channel statistics, channel type, noise level and type of noise.

7. The method of claim 1, further comprising:
   selecting of the first encoding pattern and the second encoding pattern in response to the channel characterization vector indicating a channel characteristic that breaches a function of a threshold characteristic.

8. The method of claim 1, further comprising:
   selecting of the first encoding pattern and the second encoding pattern in response to the channel characterization vector indicating that a communication channel is susceptible to burst losses in breach of a threshold.

9. The method of claim 1, further comprising:
   transmitting the sequence of source packets, the first set of parity packets and the second set of parity packets across a communication channel.

10. The method of claim 1, wherein the source packets are encrypted.

11. The method of claim 1, further comprising:
    synthesizing a third set of parity packets as a function of a third set of source packets that satisfies the first encoding pattern.

12. A method comprising:
    determining an encoding structure as a function of a channel characterization vector, wherein the encoding structure characterizes a first encoding pattern and a second encoding pattern;
    synthesizing a first set of parity packets as a function of a first set of source packets in a sequence of source packets, wherein the first set of source packets satisfies the first encoding pattern; and
    synthesizing a second set of parity packets as a function of a second set of source packets in the sequence of source packets, wherein the second set of source packets satisfies the second encoding pattern, and wherein each of the first encoding pattern and the second encoding pattern are selected based on the channel characterization vector to provide unequal protection for the source packets.

13. The method of claim 12, wherein synthesizing the first set of parity packets includes synthesizing the first set of parity packets as a function of odd-numbered source packets and even-numbered source packets in the sequence of the source packets; and wherein synthesizing the second set of parity packets includes synthesizing the second set of parity packets as a function of odd-numbered packets in the sequence of the source packets.

14. The method of claim 12, further comprising:
determining the channel characterization vector as a function of one or more of channel statistics, channel type, noise level and type of noise.

15. The method of claim 12, further comprising:
selecting the first encoding pattern and the second encoding pattern in response to the channel characterization vector indicating a channel characteristic that breaches a function of a threshold characteristic.

16. The method of claim 12, further comprising:
selecting the first encoding pattern and the second encoding pattern in response to the channel characterization vector indicating that a communication channel is susceptible to burst losses in breach of a threshold.

17. The method of claim 12, further comprising:
transmitting the sequence of source packets, the first set of parity packets and the second set of parity packets across a communication channel.

18. An encoding unit comprising:
a processor configured to execute computer readable instructions included on a non-transitory memory; and
a non-transitory memory including computer readable instructions, that when executed by the processor, cause the encoding unit to:

determine a sequence of source packets, wherein the sequence of source packets satisfies a windowing condition;

synthesize a first set of one or more parity packets as a function of a first set of source packets in the sequence, wherein the first set of source packets satisfies a first encoding pattern; and synthesize a second set of parity packets as a function of a second set of source packets in the sequence, wherein the second set of source packets satisfies a second encoding pattern that is different from the first encoding pattern, wherein the first encoding pattern and the second encoding pattern characterizes an encoding structure determined as a function of a channel characterization vector, and wherein each of the first encoding pattern and the second encoding pattern are selected based on the channel characterization vector to provide unequal protection for the source packets.

19. The encoding unit of claim 18, wherein the computer readable instructions further cause the encoding unit to:
determine the channel characterization vector as a function of one or more of channel statistics, channel type, noise level and type of noise.

20. The encoding unit of claim 18, wherein the computer readable instructions further cause the encoding unit to:
select the first encoding pattern and the second encoding pattern in response to the channel characterization vector indicating a channel characteristic that breaches a function of a threshold characteristic.

* * * * *